(12) United States Patent
Loh et al.

(10) Patent No.: US 7,551,414 B2
(45) Date of Patent: Jun. 23, 2009

(54) ELECTROSTATIC DISCHARGE SERIES PROTECTION

(75) Inventors: William M. Loh, Fremont, CA (US); Choshu Ito, San Mateo, CA (US); Jau-Wen Chen, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 488 days.

(21) Appl. No.: 11/300,938

(22) Filed: Dec. 15, 2005

(65) Prior Publication Data

US 2007/0138973 A1    Jun. 21, 2007

(51) Int. Cl.
*H02H 9/00* (2006.01)

(52) U.S. Cl. ...................................... 361/56

(58) Field of Classification Search .................... 361/56
See application file for complete search history.

(56) References Cited

U.S. PATENT DOCUMENTS

| | | | | |
|---|---|---|---|---|
| 5,495,383 A | * | 2/1996 | Yoshioka et al. | 361/56 |
| 5,901,022 A | * | 5/1999 | Ker | 361/56 |
| 6,104,149 A | * | 8/2000 | Pelly | 318/400.21 |
| 6,911,700 B2 | * | 6/2005 | Okamoto | 257/355 |
| 6,932,574 B2 | * | 8/2005 | Wobben | 416/146 R |
| 7,029,801 B2 | * | 4/2006 | Yuasa | 430/5 |
| 2003/0011442 A1 | * | 1/2003 | Ashoka | 333/116 |
| 2003/0058591 A1 | * | 3/2003 | Johnson | 361/56 |
| 2005/0162790 A1 | * | 7/2005 | Yoshinaga | 361/56 |
| 2005/0218454 A1 | * | 10/2005 | Saiki et al. | 257/355 |
| 2008/0055803 A1 | * | 3/2008 | Kienmayer et al. | 361/56 |

FOREIGN PATENT DOCUMENTS

KR    2004078943 A    *    9/2008

* cited by examiner

*Primary Examiner*—Stephen W Jackson
*Assistant Examiner*—Ann T Hoang
(74) *Attorney, Agent, or Firm*—Luedeka, Neely & Graham, P.C.

(57) ABSTRACT

An improvement to a digital integrated circuit of the type having a functional circuit that is susceptible to damage from an electrostatic discharge. An electrostatic discharge protection element is placed in series with the functional circuit and disposed upstream in a normal direction of current flow from the functional circuit. The electrostatic discharge protection element includes at least one of a resistive choke that exhibits thermal runaway and an inductive choke.

6 Claims, 1 Drawing Sheet

ELECTROSTATIC DISCHARGE SERIES PROTECTION

FIELD

This invention relates to the field of integrated circuit fabrication. More particularly, this invention relates to a design for a protection circuit to protect the functional circuit from electrostatic discharge.

BACKGROUND

Most integrated circuits are designed to carry a given, relatively small amount of current, on the order of about ten milliamperes. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

When a current flow that is larger than that for which the integrated circuit is designed is passed through the circuit, the current flow tends to destroy various elements of the integrated circuit, such as gate dielectrics and junction, rendering it either unstable or inoperable. One source of excessive current flow is called electrostatic discharge. Electrostatic discharge is a general condition where a charge imbalance builds up over a period of time, caused by one or more of a variety of conditions, and then is suddenly released. The current flow, although extremely brief, can be quite high, such as on the order of about ten amperes, or about 10,000 times the normal operating current of an integrated circuit. Electrostatic discharge is not an uncommon occurrence in circuits. If unaccounted for in the design of integrated circuits, electrostatic discharge can potentially be a major cause of failure for integrated circuits.

Various methods and structures for the shunting of electrostatic discharge have been proposed. For example, shunting circuits operate to divert the current flow from an electrostatic discharge around the functional portions of the integrated circuit and through the shunt, which is designed to accommodate a larger current flow. Unfortunately, this method of protection requires the circuit designer to identify every circuit path that the discharge might follow, and insert an appropriate shunt around each such discharge path. Such shunts are placed in parallel to the circuits that they are designed to protect.

What is needed, therefore, is a system for inhibiting electrostatic discharge from damaging integrated circuits that overcomes problems such as those described above, at least in part.

SUMMARY

The above and other needs are met by an improvement to a digital integrated circuit of the type having a functional circuit that is susceptible to damage from an electrostatic discharge. An electrostatic discharge protection element is placed in series with the functional circuit and disposed upstream in a normal direction of current flow from the functional circuit. The electrostatic discharge protection element includes at least one of a resistive choke that exhibits thermal runaway and an inductive choke.

By using a direct series protection device in this manner, the many discharge paths do not need to be identified. Instead, The electrostatic discharge current is arrested where it enters the circuit to be protected. The protection point can be either very near the circuit to be protected, or very far upstream from the circuit. Because there tend to be fewer entrance paths than exit paths for electrostatic discharge, the implementation of these series protection devices can be much easier than that of parallel protection devices.

In various preferred embodiments, the electrostatic discharge protection element is only the resistive choke, only the inductive choke, or both the resistive choke and the inductive choke. The resistive choke preferably has at least one of (1) a material having a relatively high temperature coefficient of resistance, from which the resistive choke is formed, (2) a material having a relatively high specific heat capacity, within which the resistive choke is immediately disposed, and (3) a pinch point that creates a relatively high current density within the pinch point of the resistive choke. The inductive choke is preferably at least one of a spiral inductor, a relatively long electrically conductive line, a ferrite block, bonding wires between the integrated circuit and a package substrate on which the integrated circuit is packaged, and a transmission line with dead-end electrically conductive stubs disposed along its length.

The electrostatic discharge protection element may be disposed on a common monolithic substrate with the integrated circuit, on a package substrate on which the integrated circuit is packaged, or between the integrated circuit and the package substrate on which the integrated circuit is packaged. When the electrostatic discharge protection element is only the inductive choke, then it may include an additional parallel shunt impedance element. The resistive choke preferably includes at least one of a copper bottleneck, a polysilicon line, a salicided polysilicon resistor, a non-salicided polysilicon resistor, and a tungsten contact.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
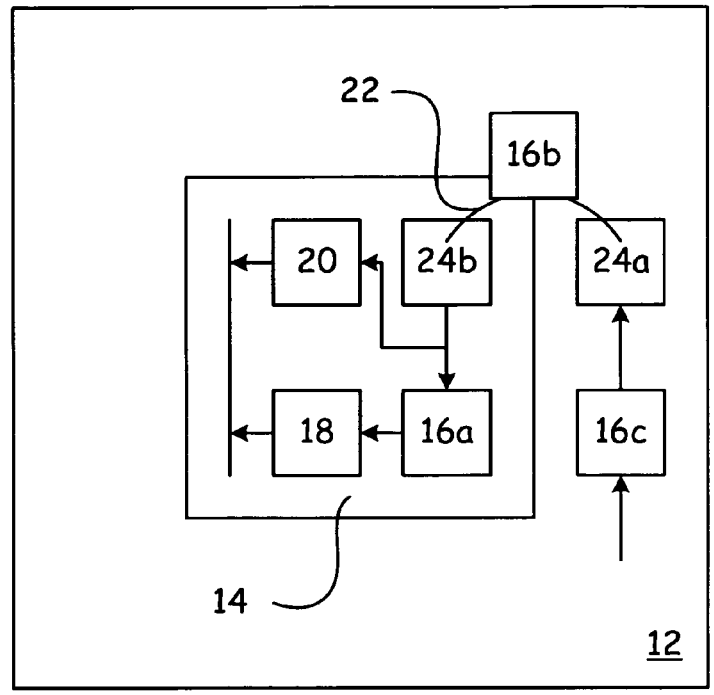
FIG. 1 is a functional block diagram of an integrated circuit mounted on a package substrate and electrically connected to the package substrate via a bonding wire.

Direct series protection devices, also referred to as blocking devices, impedance devices, or chokes herein, are beneficial because the discharge paths do not need to be identified. Instead, the onslaught of electrostatic discharge current is arrested at its entrance. Because there tend to be fewer entrance paths than exit paths for electrostatic discharge, the implementation of series protection devices can be much easier than that of parallel protection devices. FIG. 1 is a functional block diagram of a packaged integrated circuit 10, and provides a general overview of the elements of the present invention, as described below.

There are two basic types of series impedance devices 16 according to the present invention: (1) resistor devices 26 and (2) inductor devices 28, as depicted in FIGS. 2-6. The main attributes of each type of serial device 16 is that the impedance of the protection device 16 preferably remains relatively small during normal integrated circuit 14 operation in relation to the rest of the circuit 18 in which it is disposed, so that the impedance of the protection device 16 does not significantly degrade the operation of the integrated circuit 14, such as its speed. For the present purposes, "relatively small impedance" means that the series protection impedance is less than about 5% of the total impedance of the I/O net. However, the impedance of the protection device 16 becomes relatively large during an electrostatic discharge event, thereby blocking large currents from flowing through the integrated circuit 14. In other words, the series protection device impedance 16, after increasing its impedance, will be at least several times the normal I/O net 18 impedance, and large enough to reduce the electrostatic discharge current going into the system 18 by more than about twenty percent.

Resistive Choke

The operation of resistive chokes 26 is based on a phenomenon called joule heating. Ohm's law states that the voltage drop (measured in volts) across a resistor is equal to the resistance of the resistor (measured in ohms) multiplied by the current (measured in amperes) flowing through the resistor. Thus, the higher the electrostatic discharge current, the larger the drop in the voltage across the protection resistor 26, which thereby reduces the electrostatic discharge voltage appearing at the end of the protection resistor 16.

In order not to lower performance during normal chip operation, the resistance of the protection resistor 26 preferably remains small during the normal operation of the integrated circuit 14, but becomes large when a large current is detected, such as during an electrostatic discharge event. One method of accomplishing this change in resistance is to use the temperature rise that is caused by joule heating within a resistor during an electrostatic discharge event.

The large current that starts to flow through the protection resistor 26 causes an increase in the current density within the resistor 26. The increase in current density causes heating in the resistor 26, due to the joule effect. For the present purposes, a "relatively high current density" means more than an order of magnitude increase in the normal operating mode current density. The heating of the resistor 26 increases the resistivity of the resistor material, which thereby increases the resistance of the protection resistor 26. The increase in the resistance then causes more heating within the protection resistor 26. Thus, as a large current occurs, such as from an electrostatic discharge event, the resistance of the protection resistor 26 rises, thereby reducing the output voltage on the protection resistor 26 and protecting all of the downstream circuits 18.

This spiraling cycle of heating, which causes more resistance, which causes more heating, is generally called thermal runaway and is greatly disfavored in the resistors that are used in integrated circuits. The reason for this is that circuit designers want their circuits to operate predictably under a wide range of conditions. Therefore, great effort is made to design a resistor that will not experience this thermal runaway.

According to the present invention, however, special protection resistors 26 are inserted into the circuit design, which are specifically designed to exhibit a relatively high degree of thermal runaway. For the present purposes, a "relatively high degree of thermal runaway" means a degree at which the current from an electrostatic discharge event is reduced to a point that equilibrium is achieved. For example, if the current density is increased by three times, the joule heating may increase by ten times, which causes the resistance to double—this positive feedback cycle fuels the thermal runaway. The resistance will keep on increasing until it becomes so big that it starts to reduce the current, at which point equilibrium is achieved.

There are a few different methods by which such a resistor 26 can be fabricated. For example, selecting a material for the resistor 26 that has a "relatively large temperature coefficient of resistance," which is defined as a temperature coefficient of resistance of from about three thousand parts per million per centigrade to about six thousand parts per million per centigrade, within the temperature ranges anticipated for normal use of integrated circuits. Some materials have a very little change in resistance as they are heated, while other materials have a very large change in resistance as they are heated. The property of the material that controls this effect—whether it be large or small—is called the temperature coefficient of resistance of the material. Resistors in standard integrated circuit designs are fabricated with materials having low temperature coefficients of resistance, meaning that their resistance tends to change very little, or not at all, as they heat.

Another method by which such a protection resistor 26 can be fabricated is to thermally insulate the resistor 26, such that any heat generated by the resistor tends to remain trapped within the resistor, thereby causing an elevation in the temperature of the resistor 26, and thereby further exacerbating the thermal runaway of the protection resistor 26. Low k dielectric materials tend to have a relatively low thermal conductivity, meaning about an order of magnitude lower than that of silicon dioxide. This means that they do not dissipate heat quickly to surrounding structures. Thus, immediately surrounding the protection resistor 26 with a material having a relative low thermal conductivity, with no heat absorbing materials between the two, tends to enhance the protection properties of the resistor 26.

Figure 5:
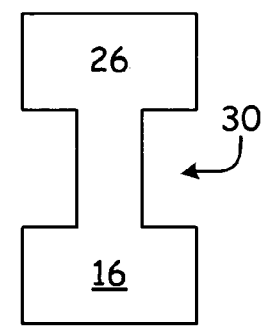
FIG. 5 is a circuit diagram of a resistive choke electrostatic discharge protection device with a pinch point according to a preferred embodiment of the invention.

Yet another method of enhancing the desired properties of a choke resistor 26 is to fabricate the protection resistor 26 with a geometry or shape that enhances the joule heating effect. One way of accomplishing this is to reduce the cross sectional area of the resistor 26 at some point along its length, such as by either reducing its width, thickness, or both, as depicted in FIG. 5. In so doing, the current density within this pinch point 30 of the resistor 26 is naturally increased, regardless of the amount of current that is flowing through the protection resistor 26. As described above, this increase in current density tends to trigger the joule heating effect, which is the basis for the choke. Increasing the length of the resistor 26 within this pinch point 30 may also increase the thermal runaway.

By combining elements such as these in the design and fabrication of a protection resistor 26, a ten fold increase in the resistance of the protection resistor can be achieved. It is desirable, however, when using the methods described above, to construct a protection resistor 26 that does not have a significant amount of resistance at normal operating conditions, such that it would impair the normal operation of the circuit 14 in which it is placed. Further, it is desirable that the choke 26 does not exhibit any significant thermal runaway during normal operation of the circuit 14, for the same reasons. In normal operation, the series protection resistor 26 should have no more than about two to three ohms. During the electrostatic discharge event, the desired resistance should be at least about sixty to one hundred ohms.

Resistors 26 such as those described above can be formed of a variety of different materials and in a variety of different locations, within the parameters described above. For example, resistive materials such as polysilicon and tungsten can be used. Materials with non-linear resistivity, such as non-salicided polysilicon, can also be used. The resistive choke 26 can be implemented either on the chip of the integrated circuit 14 itself, or in the package substrate 12 on which the integrated circuit 14 is packaged, or between the integrated circuit 14 and the package substrate 12, all as depicted in FIG. 1. Possible implementation on the chip 14 includes copper bottlenecks, polysilicon lines, salicided and non-salicided polysilicon resistors, and tungsten contacts. Because these protection devices 16 work in series, they can be placed at the many fewer inlets for electrostatic discharge current, rather than in parallel with all of the many discharge paths.

Inductive Choke

The voltage drop across an inductor is equal to the inductance of the inductor multiplied by the time rate of change of the current flowing through the inductor. In other words, the faster the current through the inductor, the larger the voltage drop across the inductor, which reduces the voltage spike appearing at the end of the inductor. Because electrostatic discharge events tend to create very sudden current flows, an inductor 28 can work well as a serial electrostatic discharge event protection circuit 16. Similar to that as describe above in regard to the resistive choke 26, it is desired that the inductive choke 28 function in a manner where it doesn't significantly impede the normal operation of the circuit 14 that it protects. The inductance of the inductive choke 28 is preferably below about five to ten nanohenrys (defined as a "relatively small impedance") during normal operation of the integrated circuit 14, in order for its impedance to not alter the performance of the circuit 14.

Therefore, in order to not lower the performance of the integrated circuit 14 during normal operation, the impedance of the inductor 28 preferably remains relatively small during normal operation of the circuit 14, but becomes relatively large when an electrostatic discharge current transient is present. A "relatively large impedance" is defined to be at least about sixty to one hundred nanohenrys, which is sufficient to reduce the electrostatic discharge current.

Figures 3, 4:
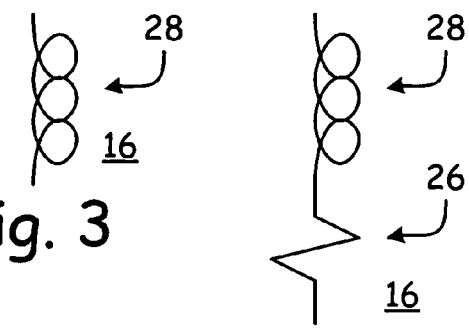
FIG. 3 is a circuit diagram of an inductive choke electrostatic discharge protection device according to a preferred embodiment of the invention.
FIG. 4 is a circuit diagram of a combined resistive choke inductive choke electrostatic discharge protection device according to a preferred embodiment of the invention.
Figure 6:
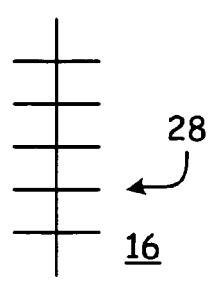
FIG. 6 is a circuit diagram of an inductive choke electrostatic discharge protection device formed from a transmission line with dead-end electrically conductive stubs along its length according to a preferred embodiment of the invention.

The inductive choke 28 can be implanted on the chip with the integrated circuit 14 (depicted as 16a in FIG. 1), such as a spiral inductor as depicted in FIG. 3, a long metal line, and a transmission line with stubs as depicted in FIG. 6. For the present purposes, "long" means a metal line that is at least about a few millimeters in length. It can also be implemented off of the chip 14, such as in the package substrate 12 (depicted as 16c in FIG. 1) or between the chip 14 and the package substrate 12 (depicted as 16b in FIG. 1), such as a discrete inductor, a ferrite block, a transmission line with stubs, and bonding wires 22 between the pad 24a of the substrate and the pad 24b of the chip 14. Use of inductors is typically limited to analog circuits, rather than the digital circuits of the present invention.

Inductor chokes 28 can be designed with an additional shunt (or parallel) impedance 20, which design tends to provide better performance than either the shunt 20 or series inductor 28 alone.

Figure 2:
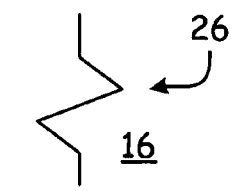
FIG. 2 is a circuit diagram of a resistive choke electrostatic discharge protection device according to a preferred embodiment of the invention.

The use of either a resistive choke 26 or an inductive choke 28 as depicted singly in FIGS. 2-3, or both together as depicted in FIG. 4, tends to require less space on the chip 14 than a shunt. Further, they block the electrostatic discharge at the entrance, without needing to know the many different discharge paths. Such chokes 16 do not affect the normal operation of the circuit 14. Resistive chokes 26 tend to block high current, and inductive chokes 28 tend to block fast current. The use of both types of chokes 16 together can block both types of events. However, electrostatic discharge events tend to have both of these characteristics, and so these two types of chokes 16 can also be used individually to protect a circuit 14 against an electrostatic discharge event.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. In a digital integrated circuit of the type having a functional circuit that is susceptible to damage from an electrostatic discharge event, the improvement comprising an electrostatic discharge protection element placed in series with the functional circuit and disposed upstream in a normal direction of current flow from the functional circuit, the electrostatic discharge protection element comprising:
   a resistive choke that exhibits thermal runaway and formed of (1) a material having a relatively high temperature coefficient of resistance, from which the resistive choke is formed, (2) a material having a relatively low thermal conductivity, within which the resistive choke is immediately disposed, and (3) a pinch point that creates a relatively high current density within the pinch point of the resistive choke, and
   an inductive choke in series with the resistive choke, and formed of a transmission line with dead-end electrically conductive stubs disposed along its length.

2. The integrated circuit of claim 1, wherein the electrostatic discharge protection element is disposed on a common monolithic substrate with the integrated circuit.

3. The integrated circuit of claim 1, wherein the electrostatic discharge protection element is disposed on a package substrate on which the integrated circuit is packaged.

4. The integrated circuit of claim 1, wherein the electrostatic discharge protection element is disposed between the integrated circuit and a package substrate on which the integrated circuit is packaged.

5. The integrated circuit of claim 1, wherein the electrostatic discharge protection element includes a parallel shunt impedance element.

6. The integrated circuit of claim 1, wherein the material having a relatively high temperature coefficient of resistance in the resistive choke comprises at least one of copper, polysilicon, salicided polysilicon, and tungsten.

* * * * *